United States Patent
Pedlow, Jr.

(10) Patent No.: US 6,944,083 B2
(45) Date of Patent: Sep. 13, 2005

(54) METHOD FOR DETECTING AND PREVENTING TAMPERING WITH ONE-TIME PROGRAMMABLE DIGITAL DEVICES

(75) Inventor: Leo Mark Pedlow, Jr., San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 10/815,348

(22) Filed: Mar. 31, 2004

(65) Prior Publication Data

US 2005/0105366 A1 May 19, 2005

Related U.S. Application Data

(60) Provisional application No. 60/520,753, filed on Nov. 17, 2003.

(51) Int. Cl.[7] .............................. G11C 7/00; G11C 17/00
(52) U.S. Cl. ....................... 365/225.7; 365/96; 365/195
(58) Field of Search .............................. 365/225.7, 96, 365/195, 196, 185.04; 713/200

(56) References Cited

U.S. PATENT DOCUMENTS

| | | | | |
|---|---|---|---|---|
| 4,931,993 A | * | 6/1990 | Urushima .............. 365/189.01 |
| 5,446,864 A | * | 8/1995 | Burghardt et al. ........... 711/100 |
| 5,469,557 A | * | 11/1995 | Salt et al. .................... 711/103 |
| 6,101,605 A | * | 8/2000 | Buer ........................... 713/189 |
| 6,707,696 B1 | * | 3/2004 | Turner et al. .................. 365/96 |

* cited by examiner

*Primary Examiner*—Son Mai
(74) *Attorney, Agent, or Firm*—Blakely, Sokoloff, Taylor & Zafman LLP

(57) ABSTRACT

According to one embodiment, an apparatus for detecting and preventing tampering with a programmable digital device. The apparatus comprises a one-time programmable (OTP) memory that includes a plurality of memory cells to store data. The plurality of memory cells may be programmed to a default state or a state opposite the default state. A tamper detection circuit is coupled to these memory cells in order to sense a condition when each bit associated with the plurality of memory cells is programmed to the state opposite the default state. In response to detecting this condition, it is considered that the programmable digital device implemented with the apparatus has been tampered with and operations are performed to combat the tampering of the digital device.

20 Claims, 8 Drawing Sheets

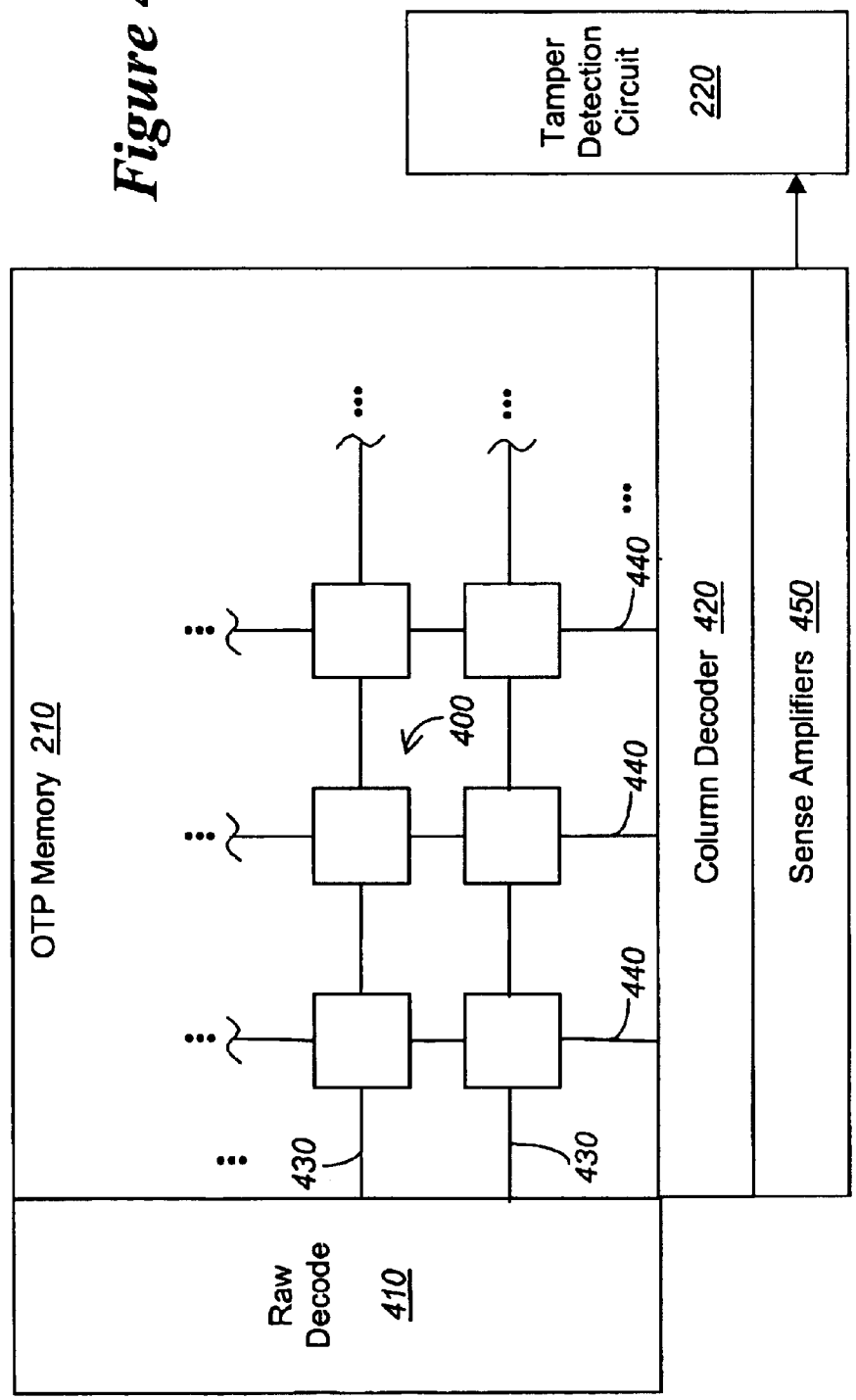

METHOD FOR DETECTING AND PREVENTING TAMPERING WITH ONE-TIME PROGRAMMABLE DIGITAL DEVICES

CROSS-REFERENCE TO RELATED APPLICATIONS

This application claims the benefit of priority on U.S. Provisional Patent Application No. 60/520,753, filed on Nov. 17, 2003.

BACKGROUND

1. Field

Embodiments of the invention relate to programmable digital devices. More specifically, one embodiment of the invention relates to a system, apparatus and method for detecting and preventing tampering with programmable digital devices.

2. General Background

Analog communication systems are rapidly giving way to their digital counterparts. High-definition television (HDTV) broadcasts have already begun in most major cities on a limited basis, with the goal for all programming to be HDTV broadcasts. Similarly, the explosive growth of the Internet and the World Wide Web have resulted in a correlative growth in the increase of downloadable audio-visual files, such as MP3-formatted audio files, as well as other content.

Simultaneously with, and in part due to this rapid movement toward digital communications, there have been significant advances in digital recording devices. Digital versatile disk (DVD) recorders, digital VHS video cassette recorders (D-VHS VCR), CD-ROM recorders (e.g., CD-R and CD-RW), MP3 recording devices, and hard disk-based recording units are but merely representative of the digital recording devices that are capable of producing high quality recordings, without the generational degradation (i.e., increased degradation between successive copies) known in the analog counterparts.

As a result, due to fears of unauthorized and uncontrolled copying such digital content, content providers such as the motion picture and music industries have become reluctant in providing downloadable digital content. In fact, there are requests for copy protection initiatives that extend beyond the traditional role of conditional access (CA), namely scrambling and descrambling of content for real-time viewing and/or listening.

One initiative in development is the implementation of CA technology in a subscriber terminal device (e.g., set-top box) using a secure embedded processor. This secure embedded processor would be configured to store sensitive data, namely cryptographic keys, certificates, microcode, gate configuration data or other persistent information for example, within an internal one-time programmable (OTP) memory.

Traditionally, OTP memory may be implemented with one or more fuses or anti-fuses. A "fuse" (or an emulation of such) involves the destructive removal of an internal interconnection to permanently change a bit in OTP memory from a manufactured default state of logic "1" (ONE) to logic "0" (ZERO). Once performed, this transition can never be reversed. An "anti-fuse," however, has all bits programmed to ZERO by default and the transition is to ONE. Both of these configurations enable the OTP memory to permanently disable external read or write accesses after the sensitive data has been loaded. However, by their nature, OTP memory is susceptible to security attacks.

For instance, security attacks may be conducted to gain unauthorized access to read the sensitive data in order to clone or create methods to circumvent it. Such attacks may be conducted to alter or substitute data in place of the bona fide preloaded, sensitive data to circumvent normal operation of the secure processor. As a result, the operations of the secure processor may be disrupted or incoming content made be decrypted by unauthorized parties.

One of the simpler methods of attack is to "blind write" over existing key data to change the OTP keys to a deterministic (known) value. One such method is to take advantage of the fuse or anti-fuse logic by changing the unique keys from their original value to all ONEs or ZEROes, depending upon the fuse technology deployed. More specifically, if all ones (or conversely all ZEROes) are written into the memory location reserved for the OTP keys, the existing contents will be transitioned to a deterministic value, regardless of the prior state, even without being able to read the memory.

With known values now installed in the OTP memory, content can be then freely accessed through the transmission of an entitlement management message (EMM) entitling the device to decode all content. Alternatively, the subscriber terminal device may be permanently rendered non-functional if a malicious blind write is made to a memory area of programmable logic containing gate configuration data, or a memory area of an embedded microcontroller or digital signal processor containing microcode or algorithms.

BRIEF DESCRIPTION OF THE DRAWINGS

Embodiments of the invention are illustrated by way of example and not by way of limitation in the accompanying drawings, in which like references indicate similar elements and in which:

FIG. 4 is an exemplary embodiment of the coupling between the OTP memory and tamper detection circuit of FIG. 2;

DETAILED DESCRIPTION

Various embodiments of the invention relate to a system, apparatus and method for detecting and preventing tampering with a programmable digital device. According to one embodiment of the invention, the programmable digital device comprises one-time programmable (OTP) memory for storage of data involved in the decoding of digital content, normally encoded prior to transmission to the digital device. As described herein, the decoding operations are performed completely within the digital device. Of course, exclusive decoding operations internally within the digital device are not required to practice the invention.

In the following description, certain terminology is used to describe features of the invention. For instance, a "message" is generally defined as a series of bits while "digital content" may include, but is not limited or restricted to an image, audio, video or any combination thereof. The terms "component" or "logic" are each representative of hardware and/or software configured to perform one or more functions.

Examples of "hardware" include, but are not limited or restricted to an integrated circuit such as a processor (e.g., microprocessor, application specific integrated circuit, a digital signal processor, a micro-controller, programmable logic device, etc.), combinatorial logic (e.g., logic gates) or the like.

Examples of "software" include a series of executable instructions in the form of an application, an applet, or even a routine. The software may be stored in any type of machine readable medium such as a programmable electronic circuit, a semiconductor memory device such as volatile memory (e.g., random access memory, etc.) and/or non-volatile memory (e.g., any type of read-only memory "ROM", flash memory), a floppy diskette, an optical disk (e.g., compact disk or digital video disc "DVD"), a hard drive disk, tape, or the like.

The term "decode" and varying forms thereof is generally defined as the transformation of data from an obfuscated format to a perceivable format (e.g., viewable and/or audible). Since an obfuscated format may be an encrypted format or a scrambled format for example, decode operations may involve descrambling and/or decryption. Likewise, the term "encode" and varying forms thereof is generally defined as the transformation of data from a perceivable (clear) format to an obfuscated (encrypted, scrambled, etc.) format.

Figure 1:
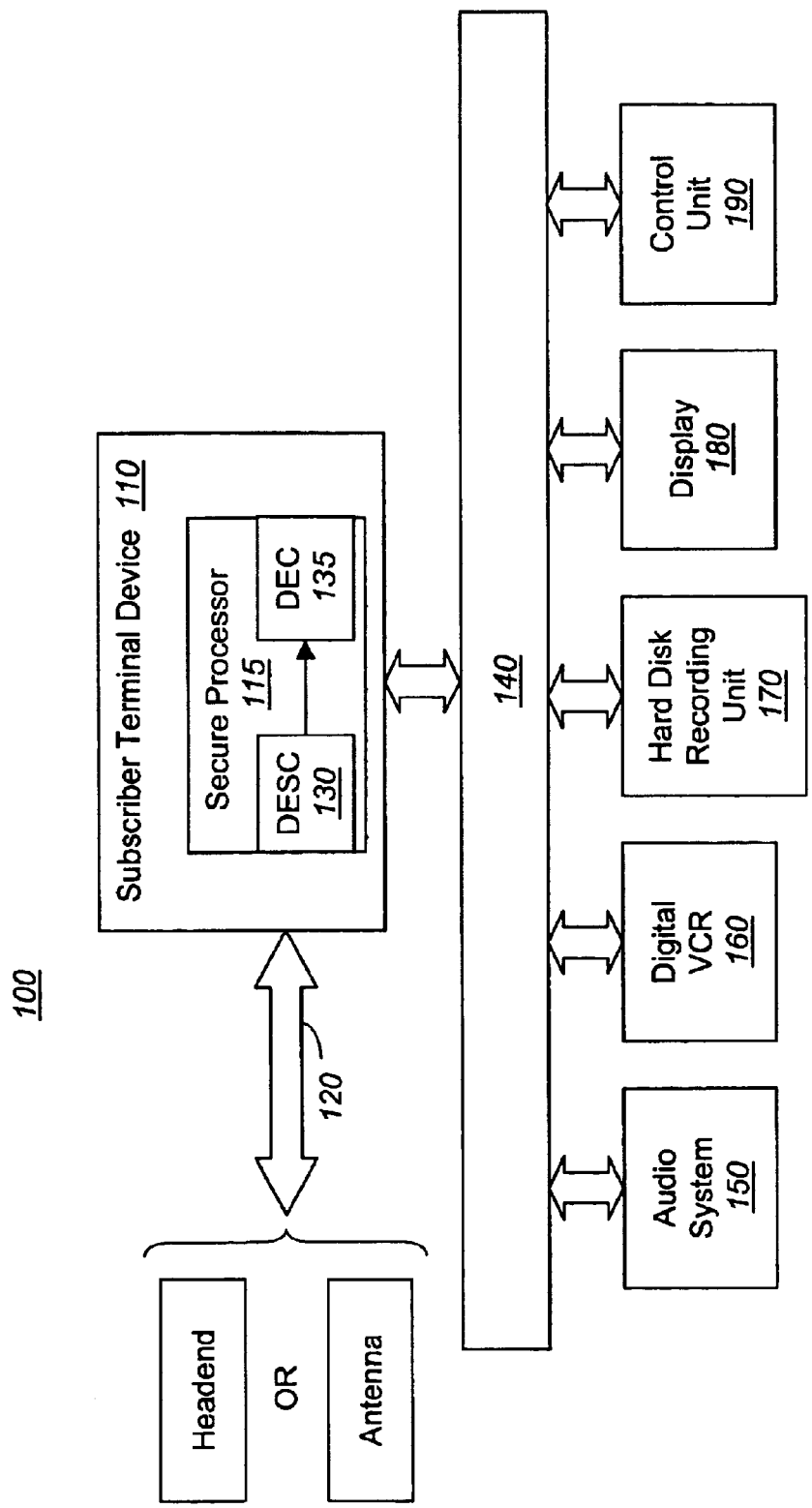
FIG. 1 is an exemplary embodiment of a content delivery system.

Referring to FIG. 1, an exemplary embodiment of a content delivery system 100 is shown. Content delivery system 100 includes a subscriber terminal device 110 that receives information including program data from one or more content providers. Examples of "content providers" may include, but are not limited to terrestrial broadcasters, cable operators, wireless carriers, direct broadcast satellite (DBS) companies, companies providing content for download via the Internet, or any similar sources of content.

The program data may be propagated as a digital bit stream for example. Subscriber terminal device 110 may operate as any of a wide variety of products such as a set-top box, television, cellular telephone, computer, audio-recording device (e.g., MP3 player), video-recording device (e.g., digital recorder), digital satellite receiver, cable modem, products with Ethernet interfaces, smart card based products or the like.

According to one embodiment of the invention, subscriber terminal device 110 comprises a secure processor 115, which processes the incoming information received over a first transmission medium 120. This "transmission medium" may include, but is not limited to electrical wires, optical fiber, cable, a wireless link established by wireless signaling circuitry, or the like. First transmission medium 120 may be adapted to transfer the incoming information from a headend (cable), an antenna via a content provider, or even one or more peripheral components described below.

After receipt of the incoming information, secure processor 115 extracts the program data, inclusive of encoded digital content, and places the encoded digital content into a perceivable format. For instance, secure processor 115 comprises a descrambler (DESC) 130 to descramble scrambled digital content and/or a decryption component (DEC) 135 to decrypt the received digital content when placed in an encrypted format.

More specifically, subscriber terminal device 110 utilizes secure embedded processor 115 that decodes payloads carried in both entitlement control messages (ECMs) and entitlement management messages (EMMs). An ECM is a copy management command message that is generally used to regulate access to a particular channel or service. An EMM, however, is another copy management command message that is used to deliver entitlements (sometimes referred to as "privileges") to subscriber terminal device 110. Examples of certain entitlements may include, but are not limited to access criteria and/or descrambling keys.

As an exemplary illustration, secure processor 115 may be adapted to extract access criteria associated with the desired encoded content, such as a television broadcast or movie, from the ECM and compare the recovered access criteria with previously sent entitlements contained in the EMM. If a match is detected, a key for the desired encoded content, contained in the ECM along with the access criteria, is recovered and applied to descrambler 130 and/or decryption component 135 for recovery of clear text content for display, storage or other use. The recovery of the key for the desired encoded content may require additional processing (e.g., key ladder or chain) before use by descrambler and/or decryption component 135 as described below.

As shown in FIG. 1, subscriber terminal device 110 is coupled to other components in content delivery system 100 via a second transmission medium 140. Second transmission medium 140 operates to transfer program data between subscriber terminal device 110 and peripheral components in content delivery system 100.

Depending on the type of product corresponding to the subscriber terminal device 110, content delivery system 100 may include an audio system 150 coupled to second transmission medium 140. A digital VCR 160, such as a D-VHS VCR, may also be coupled to subscriber terminal device 110 as well as other peripheral components of content delivery system 100 through second transmission medium 140.

A hard disk recording unit 170 may also be coupled to subscriber terminal device 110 and other peripheral components via transmission medium 140. Display 180 may include a high definition television display, a monitor, or another device capable of processing digital video signals. Finally, a control unit 190 may be coupled to second transmission medium 140. Control unit 190 may be used to coordinate and control the operation of some or each of the components on content delivery system 100.

Figure 2:
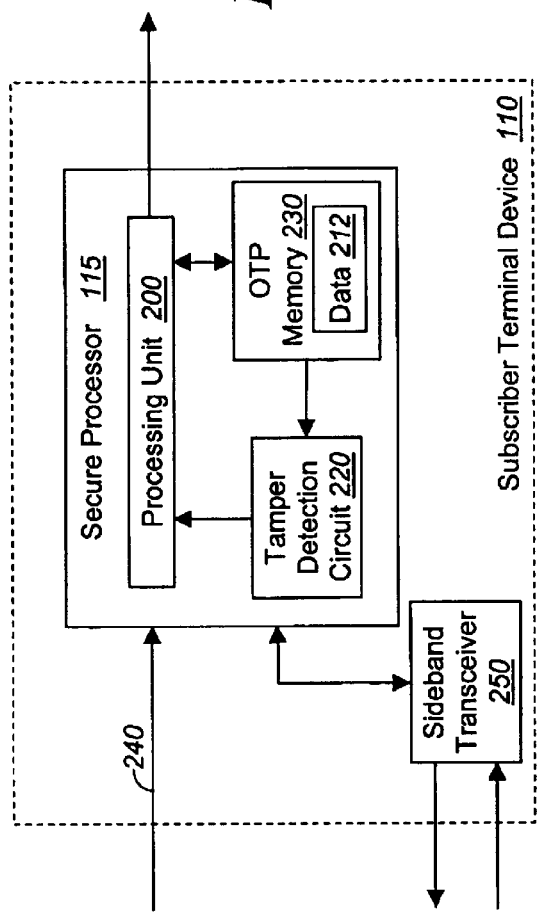
FIG. 2 is a first exemplary embodiment of a secure processor implemented within the content delivery system.

Referring to FIG. 2, a first embodiment of secure processor 115 is shown. Secure processor 115 comprises a processing unit 200 in communication with a memory 210 and a tamper detection circuit 220. According to this embodiment of the invention, processing unit 200 comprises descrambler 130 and/or decryption component 135 of FIG. 1.

Figure 6A:
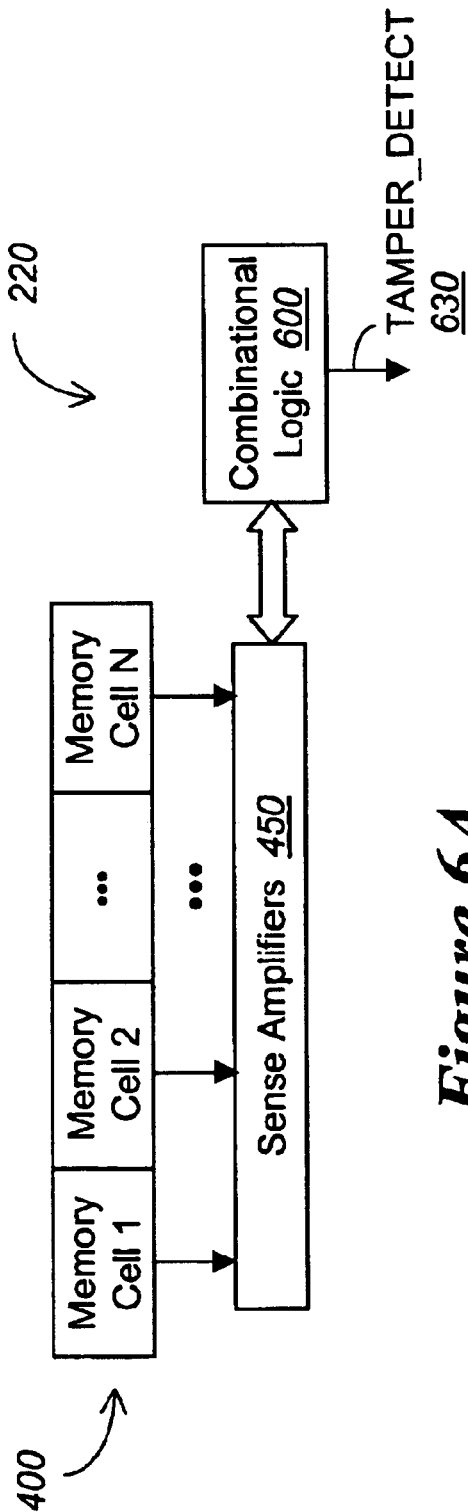
FIGS. 6A–6C collectively illustrate a first exemplary embodiment of the tamper detection circuit of FIG. 2.

As further shown in FIG. 2, memory 210 is a one-time programmable (OTP) memory implemented within a package 230 as a separate integrated circuit (IC) or as on-chip memory for processing unit 200. Tamper detection circuit 220 monitors a state of OTP memory 210 to detect an illicit write event (e.g., a "blind write" or other malicious write operation), and if detected, performs one or more operations to counter the illicit write event. Illustrative examples of tamper detection circuit 220 are shown in FIGS. 6A–7.

At some point in its lifecycle, OTP memory 210 for subscriber terminal device 100 is provisioned with sensitive data 212. Sensitive data 212 may be some form of a device specific, serialized or otherwise unique master key or certificate for use in subsequent operations to authenticate or recover cryptographic keys. According to another embodiment, sensitive data 212 may be an algorithm, microcode, gate configuration data or another type of data that, if tampered with, could adversely effect the operations of subscriber terminal device 100 or allow decoding of content by unauthorized parties.

As an illustrative example, upon receipt of program data 240 by subscriber terminal device 100, a key is recovered. The key may be from an ECM, which is a portion of program data 240. Of course, as an alternative embodiment, the key may be transmitted as part of a sideband message for receipt by an optional sideband transceiver 250 coupled to secure processor 115. Sensitive data 212 may be used as a device-specific master key to recover one or more decoding keys.

Figure 3:
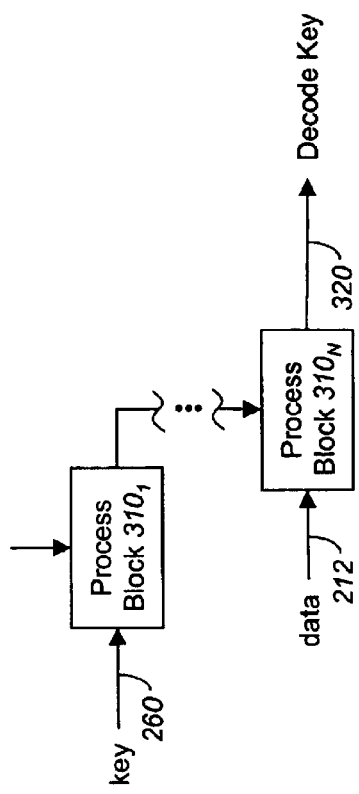
FIG. 3 is an exemplary embodiment of a key ladder used to produce a decode key.

As shown in FIG. 3, after recovery, the key (e.g., key 260) may be processed through a plurality (N) of process blocks $310_1$–$310_N$ (N≧1), which collectively forms a key chain or key ladder 300. Each process block $310_1$, . . . , or $310_R$ (R≧1) performs an operation on recovered key 260 (or derivative thereof) to ultimately produce a decode key 320 using sensitive data 212. These operations may include, but are not limited or restricted to decryption, descrambling, hashing, or the like. The decryption operation may be in accordance with symmetric key cryptographic functions such as Data Encryption Standard (DES), 3DES, Advanced Encryption Standard (AES), IDEA, and the like.

Referring now to FIG. 4, an exemplary embodiment of the coupling between OTP memory 210 and tamper detection circuit 220 is shown. OTP memory 210 comprises a plurality of memory cells 400 arranged in "M" rows and "N" columns, where M≧1 and N≧1. These memory cells 400 of OTP memory 210 are accessed through a row decoder 410 and a column decoder 420, both operating in tandem to select appropriate word lines (WL) 430 and bit lines (BL) 440 to access stored data. Sense amplifiers 450 may be coupled to bit lines 440 to obtain logical readings of memory cells 400. The outputs of these sense amplifiers 450 are coupled to tamper detection circuit 220.

Figure 5B:
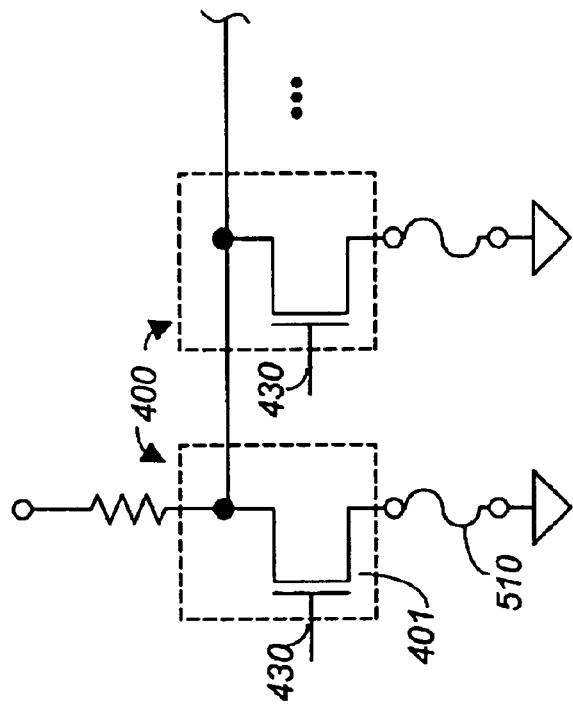
FIG. 5B is an exemplary embodiment of an anti-fuse logic memory cell of the OTP memory.
Figure 5A:
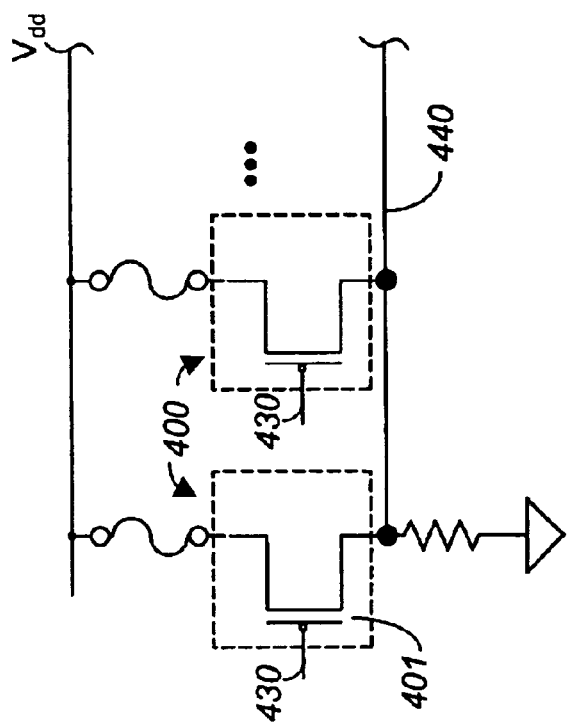
FIG. 5A is an exemplary embodiment of a fuse logic memory cell of the OTP memory.

For instance, when memory cells 400 are adapted with fuse logic, as shown in FIG. 5A, destruction of an internal interconnection 500 disconnects a voltage rail 510 ($V_{dd}$) from a first memory cell 401 of memory cells 400. This permanently changes a measured logical value in first memory cell 401 to ZERO. Otherwise, first memory cell 401 would be maintained in the default logic state (ONE). Alternatively, when memory cells 400 are adapted with anti-fuse logic, as shown in FIG. 5B, destruction of an internal interconnection 510 permanently changes a measured logical value in first memory cell 401 to a ONE. Otherwise, first memory cell 401 would be maintained in the default logic state (ZERO). Of course, it is contemplated that OTP memory 210 may be accomplished through other types of memory, such as embedded logic managing FLASH type memory for example.

For all of these memory architectures, external read and write accesses are permanently disabled after sensitive data 212 has been loaded. In an actual implementation, sensitive data 212 may be stored through the use of a write-once, write-only memory architecture wherein the data is written once through the use of fuse, anti-fuse or other logic with the elements necessary for buffering the signal to allow reading the contents on an external bus for example.

Figure 6C:
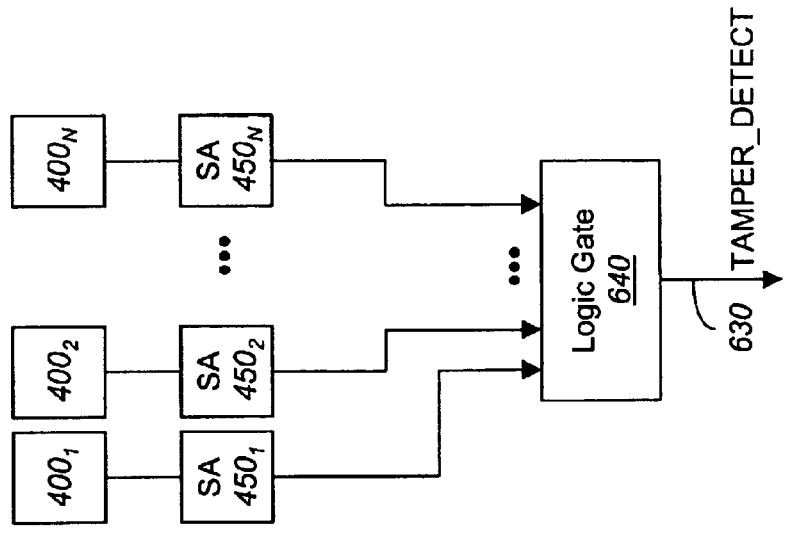
Figure 6B:
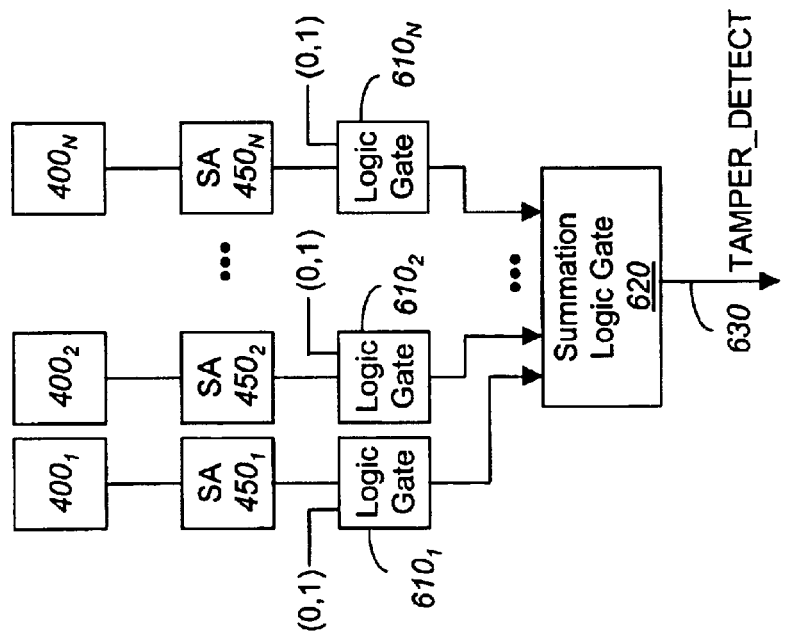
Figure 7:
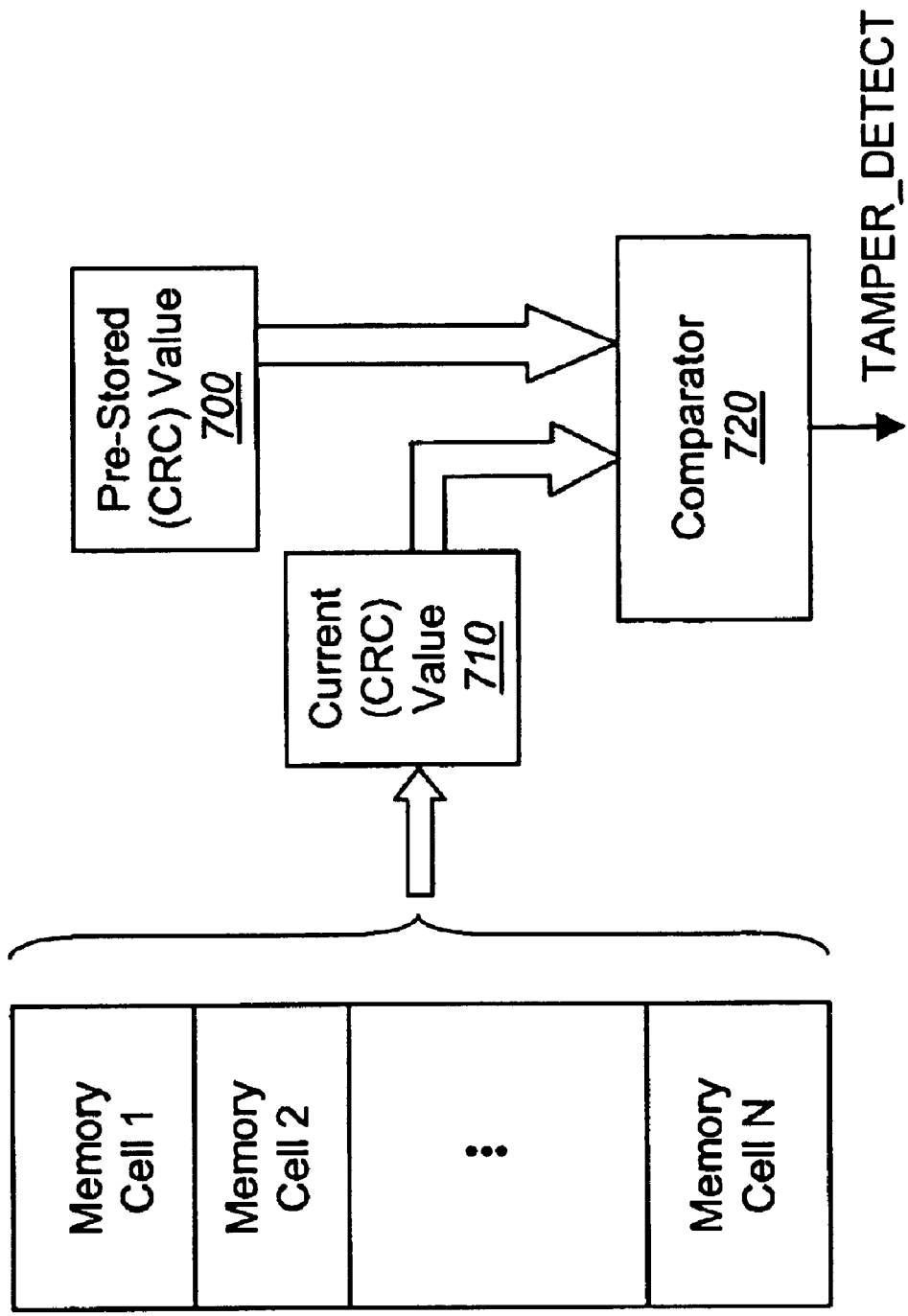
FIG. 7 is a second exemplary embodiment of the tamper detection circuit of FIG. 2.

Referring now to FIGS. 6A–6C, a first exemplary embodiment of tamper detection circuit 220 is shown. Herein, combinatorial logic 600 is coupled to sense amplifiers 450 associated with memory cells 400 responsible for storage of sensitive data 212 (not shown). If combinatorial logic 600 detects that all of the memory cells 400 have transitioned to the same value opposite the default logical value, combinatorial logic 600 set a TAMPER_DETECT flag 630 to indicate that OTP memory 210 has been tampered.

As an example, logic gates (e.g., NAND gates) $610_1$–$610_N$ may be coupled to an output of each sense amplifier (SA) $450_1$–$450_N$, which correspond to memory cells $400_1$–$400_N$ coupled to bit line $440_1$–$440_N$, respectively. Memory cells $400_1$–$400_N$ are assigned for storage of sensitive data 212 (not shown). The outputs of these logic gates $610_1$–$610_N$ are provided as input into a summation logic gate (e.g., N-input NAND gate) 620. If the summation of all logic gates 600 tracking the individual bits indicates that memory cells $400_1$–$400_N$ have all transitioned to the same value in opposition to the default value, namely an output of N-input logic gate 620 is equal to ONE (for fuse logic OTP memory) or ZERO (for anti-fuse logic OTP memory), TAMPER_DETECT flag 630 is set.

As another example, an N-input logic gate 640 (e.g., N-input NAND gate) may be coupled to an output of each sense amplifier $450_1$–$450_N$, which correspond to memory cells $400_1$–$400_N$ associated with bit line $440_1$–$440_N$, respectively. Memory cells $400_1$–$400_N$ are again assigned for storage of sensitive data 212 (not shown). When memory cells $400_1$–$400_N$ have all transitioned to the same value opposite the default value, logic gate 640 outputs a value that causes TAMPER_DETECT flag 630 to be set.

Referring to FIG. 7, a second exemplary embodiment of tamper detection circuit 220 is shown. Herein, the original, valid sensitive data 212 undergoes an operation to produce a derivative result. For instance, a Cyclic Redundancy Check (CRC) value 700 is computed for sensitive data 212 as originally stored in memory cells 400 of OTP memory 200. Such computation may occur at a manufacturing site or at initial power-on. The CRC value 700 is pre-stored in a memory location separate from sensitive data 212.

Periodically, data stored within memory cells 400 is accessed and undergoes CRC processing to produce a current CRC value 710. Current CRC value 710 is compared to stored CRC value 700 by comparator 720. If a match is computed, no tampering has been detected. However, if a match is not computed, a malicious write operation has occurred to memory cells 400 of OTP memory 210.

Alternatively, it is contemplated that sensitive data 212 may undergo a one-way hash function to produce a hash result in lieu of a CRC value. The same operations would occur, regardless of the manner in which the derivative result is produced.

Figure 8:
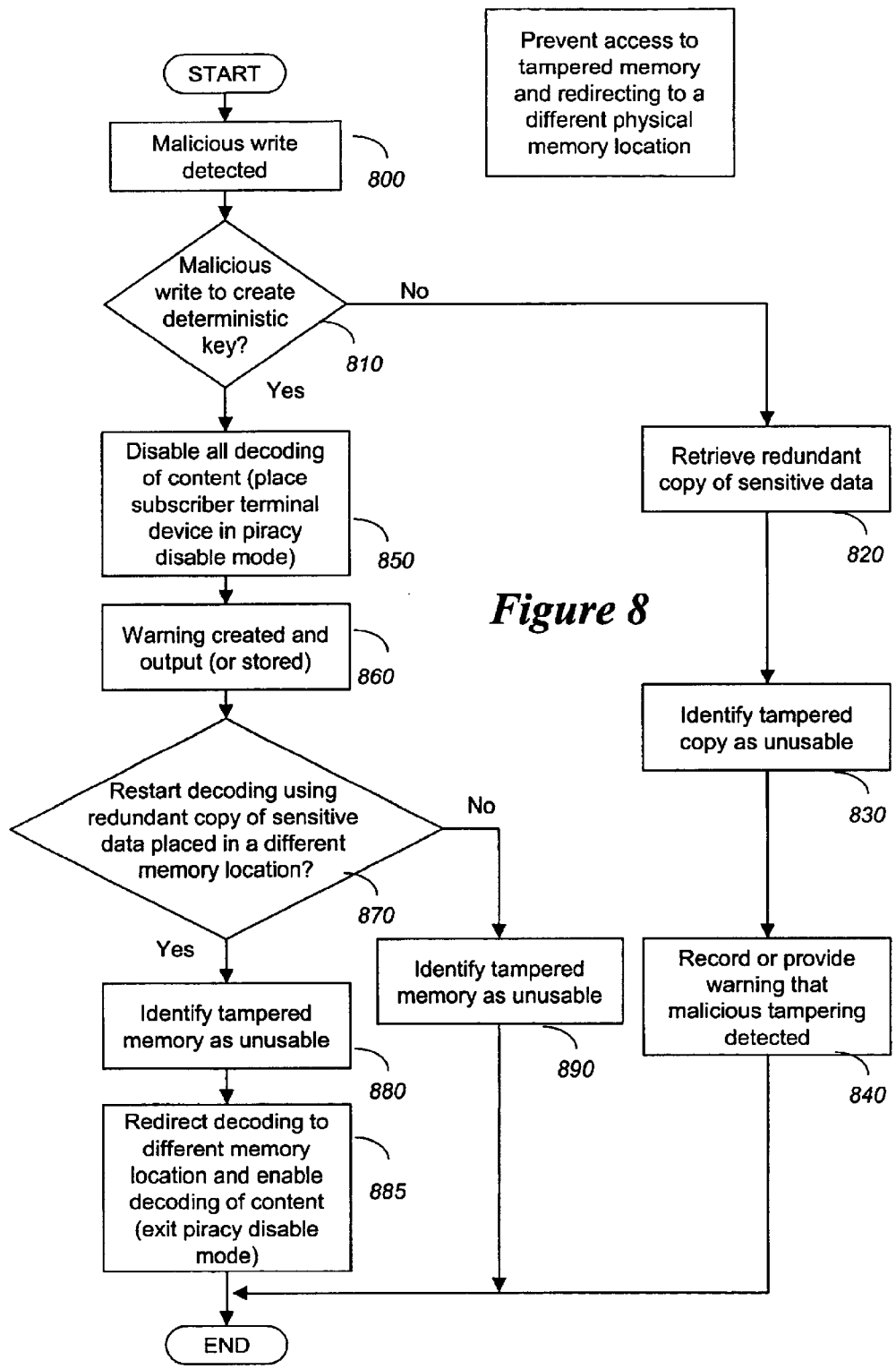
FIG. 8 is a flowchart illustrating operations in response to detection of a tampering event.

Regardless of how tampering is detected by tamper detection circuit 220 of FIG. 2, once detected, the following operations should be taken. As shown in FIG. 8, upon detecting a malicious write being performed on the sensitive data (block 800), a first determination is whether the malicious write is designed to create a deterministic key (block 810).

For instance, if the malicious write is performed upon non-key information (e.g., microcode, algorithms, gate configuration data, etc.), the malicious write is not directed toward creation of a deterministic key. In this case, a redundant (alternative) copy of the sensitive data is retrieved and the tampered copy is noted as "unusable" (blocks 820, 830). Such marking may be accomplished by the secure processor writing into one or more flag bits associated with tampered copy of the sensitive data. Hence, there will be no subsequent attempts to use the data.

If the subscriber terminal device supports bi-directional communications or any internal status or debugging data storage/display, a warning is created and output (or stored) to indicate that malicious tampering has been detected (block 840).

However, if the attack is directed toward creation of a deterministic key, the secure processor temporarily disables all decoding of content (block 850). Thereafter, a warning may be created and output (or stored) to indicate that a piracy attempt has been detected (block 860). It is contemplated that OTP memory may include to multiple secure memory locations physically separate from each other and adapted for the storage of redundant copies of the sensitive data. Therefore, if one of the memory locations is tampered with, a different secure memory location preloaded with a redundant copy of the sensitive data may be accessed if further decoding is desired (block 870). Whether or not a redundant copy of sensitive data is accessed may depend on a variety of factors, including the type or frequency of the illicit write event.

If further decoding is desired, access to the tampered memory location is prevented (block 880). According to one embodiment, prevention can be accomplished by changing a value associated with a mask register, which is used to compute the actual targeted address (memory cells) for accessing data therefrom. This effectively redirects a data access to the different secure memory location (block 885). Otherwise, if no further decoding is desired, access to the tampered memory location is merely prevented (block 890).

For instance, as an illustrative example, tampering detected at memory location "A" associated with a first plurality of memory cells activates a countermeasure to transparently remap attempted (normal) accesses to location "A" to an alternative and possibly randomized location "B" (or "C" or "D", etc.) through the use of a mask register. Combinatorial logic allows the combination of address lines, read, chip select and a map select algorithm to redirect the actual internal address lines to the new location. The map algorithm may be a value contained in yet another OTP location for a higher level of indirection. A pseudo-code example is shown in Table A:

TABLE A

1. Read 0x10000 attempted
2. No tamper detected & mask = FFFF (default)
3. Actual location 0x10000 read
1. Read 0x10000 attempted
2. Tamper detected
3. Mask changed (nonvolatile or volatile) to FFFE
4. Actual location 0x1FFAB read based upon hardcoded algorithm OR contents of other OTP memory location In the foregoing description, the invention is described with reference to specific exemplary embodiments thereof. It will, however, be evident that various modifications and changes may be made thereto without departing from the broader spirit and scope of the present invention as set forth in the appended claims. The specification and drawings are accordingly to be regarded in an illustrative rather than in a restrictive sense.

What is claimed is:

1. An apparatus, comprising:
   an one-time programmable (OTP) memory including a plurality of memory cells, the plurality of memory cells being programmed to a default state or a state opposite the default state; and
   a tamper detection circuit to sense when memory cell of the plurality of memory cells is programmed to the state opposite the default state.

2. The apparatus of claim 1, wherein each memory cell of the plurality of memory cells is adapted with fuse logic.

3. The apparatus of claim 2, wherein each memory cell of the plurality of memory cells is permanently programmed to the state opposite the default state by activating the fuse logic, and storing a data bit having a logical zero value.

4. The apparatus of claim 1, wherein each memory cell of the plurality of memory cells is adapted with anti-fuse logic.

5. The apparatus of claim 4, wherein each memory cell of the plurality of memory cells is permanently programmed to the state opposite the default state by activating the anti-fuse logic, and storing a data bit having a logical one value.

6. The apparatus of claim 1, wherein the tamper detection circuit includes combinatorial logic.

7. The apparatus of claim 6, wherein the combinatorial logic includes a plurality of NAND logical gates each coupled to one of the plurality of memory cells and a NAND gate having a plurality of inputs coupled to an output of each of the plurality of NAND logical gates.

8. The apparatus of claim 1, wherein the tamper detection circuit includes a Cyclic Redundancy Check (CRC) generator to compute a CRC value for data bits stored within the plurality of memory cells and a comparator to compare the CRC value to a pre-stored CRC value.

9. The apparatus of claim 8, wherein the pre-stored CRC value is a CRC value computed for the data bits stored within the plurality of memory cells at initial power-on of the apparatus and is stored in a memory separate from the OTP memory.

10. The apparatus of claim 1 being a processor that comprises the memory and the tamper detection circuit internally positioned within a semiconductor package of the processor.

11. An apparatus comprising:
    an one-time programmable (OTP) memory including a plurality of memory cells, the plurality of memory cells programmed to either a default state or a state opposite the default state; and
    a tamper detection circuit to sense when all of the plurality of memory cells are programmed to the state opposite the default state.

12. The apparatus of claim 11, wherein each memory cell of the plurality of memory cells is adapted with fuse logic and is permanently programmed to a logical zero value, being the state opposite the default state, by activating the fuse logic.

13. The apparatus of claim 11, wherein each memory cell of the plurality of memory cells is adapted with anti-fuse logic and is permanently programmed to a logical one value, being the state opposite the default state, by activating the anti-fuse logic.

14. The apparatus of claim 11, wherein the tamper detection circuit includes combinatorial logic.

15. The apparatus of claim 14, wherein the combinatorial logic includes a plurality of NAND logical gates each coupled to one of the plurality of memory cells and a NAND gate having a plurality of inputs coupled to an output of each of the plurality of NAND logical gates.

16. The apparatus of claim 11, wherein the tamper detection circuit includes a Cyclic Redundancy Check (CRC) generator to compute a CRC value for data bits stored within the plurality of memory cells and a comparator to compare the CRC value to a pre-stored CRC value.

17. A method comprising:

programming each of a first plurality of memory cells of an one-time programmable (OTP) memory to store data having an original bit value, the data being a series of data bits each having either a default state or a state opposite the default state and including at least one data bit having the default state and at least one data bit having the state opposite the default state;

determining whether all of the first plurality of memory cells are programmed to the state opposite the default state; and disabling incoming encoded content from being decoded using the data from the OTP memory.

18. The method of claim 17 further comprising:

issuing a warning to be perceived by the user.

19. The method of claim 17 further comprising:

accessing a second plurality of memory cells previously loaded with the data with the original bit value; and preventing access to the first plurality of memory cells.

20. The method of claim 19, wherein preventing access to the first plurality of memory cells comprises:

performing a logical operation on a stored value of the first plurality of memory cells and a value associated with a mask register; and preventing access if a value produced by the logical operation is directed to an address different from an address associated with the first plurality of memory cells.

* * * * *